United States Patent [19]

Place

[11] Patent Number: 5,014,343

[45] Date of Patent: May 7, 1991

[54] SQUELCH-TAIL ELIMINATOR

[75] Inventor: Richard A. Place, Canandaigua, N.Y.

[73] Assignee: Microwave Data Systems, Inc., Rochester, N.Y.

[21] Appl. No.: 223,335

[22] Filed: Jul. 25, 1988

[51] Int. Cl.$^5$ .............................................. H04B 1/10
[52] U.S. Cl. ...................................... 455/38; 455/212; 455/218
[58] Field of Search ............... 455/212, 213, 218, 220, 455/221, 222, 35–38

[56] References Cited

U.S. PATENT DOCUMENTS

| Re. 32,278 | 11/1986 | Yokota et al. | 455/212 |
| 2,767,310 | 10/1956 | Walker | 455/219 |
| 3,810,023 | 5/1974 | Crowley et al. | 455/35 |
| 3,962,646 | 6/1976 | Tempka | 455/218 |
| 4,020,421 | 4/1977 | Elder et al. | 455/212 |
| 4,153,878 | 5/1979 | Osborn | 455/221 |
| 4,431,991 | 2/1984 | Bailey et al. | 455/35 |
| 4,525,867 | 6/1985 | Shiratani | 455/221 |
| 4,703,507 | 10/1987 | Holden | 455/221 |
| 4,748,688 | 5/1989 | Coash | 455/212 |

Primary Examiner—Curtis Kuntz

[57] ABSTRACT

A system and method to eliminate the squelch-tail in radio receivers used for data communications. The transmitter adds a brief period of unmodulated carrier signal to the end of each data transmission. A sensor in the receiver detects this period and mutes the output of the receiver before the receiver's normal noise sensing circuitry senses that the transmission has ended. A circuit may be added to the transmitter to correct the last data bit sent in the data transmission.

11 Claims, 3 Drawing Sheets

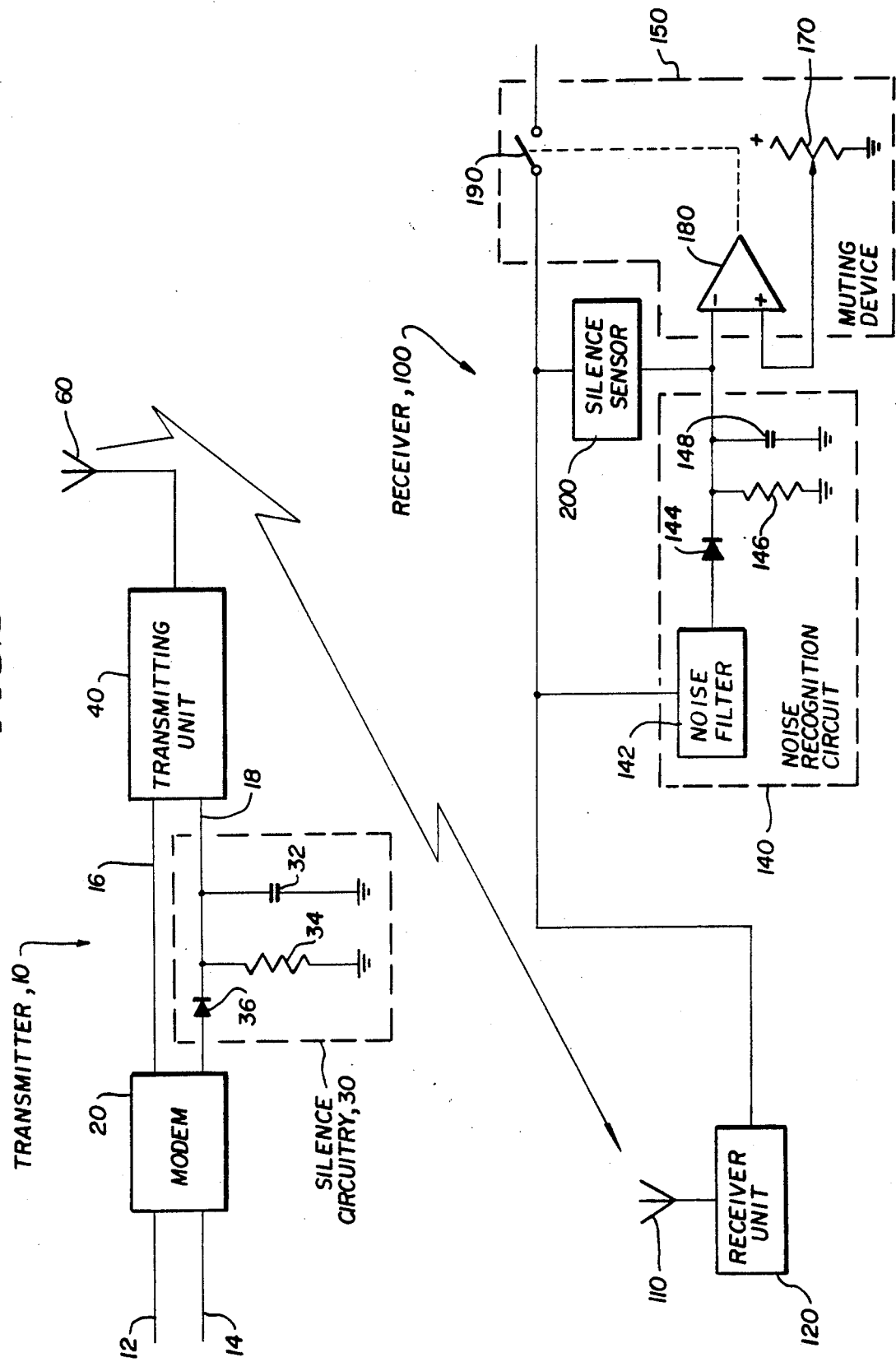

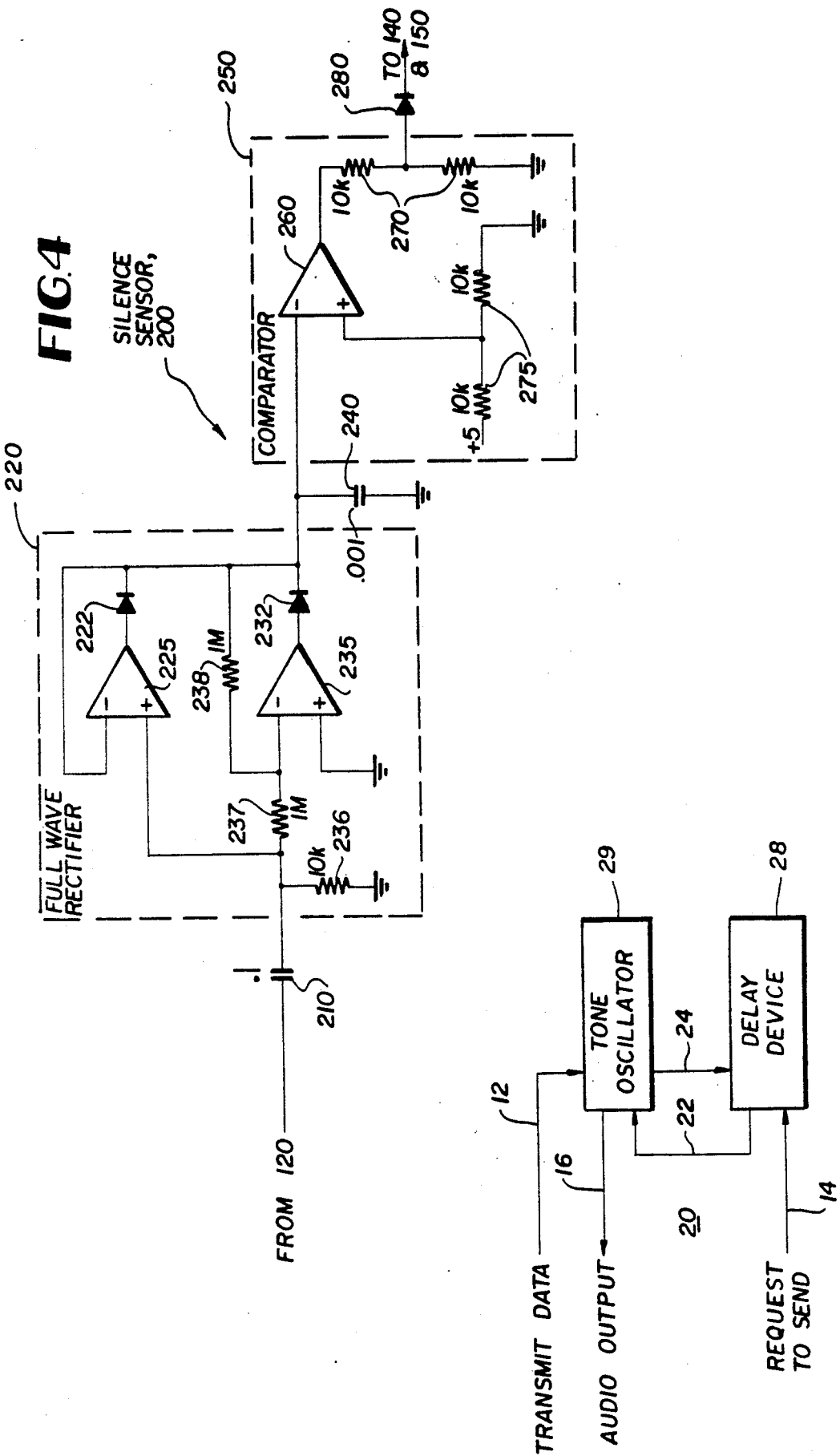

SQUELCH-TAIL ELIMINATOR

BACKGROUND OF THE INVENTION

The present invention relates to data communication systems, and more particularly to devices and methods to eliminate the squelch-tail in radio receivers used in data communication systems.

When no carrier signal is being received in a radio receiver, the receiver output is noise. Since the noise serves no useful purpose, a squelch circuit is added to the receiver to mute the receiver audio when only noise is present. Muting is especially important in data receivers because the noise may be interpreted as data characters that can give false indications to users.

Squelch circuits operate by first recognizing the presence of noise, and then muting the audio output of the radio receiver in response thereto. Devices for sensing the noise, however, require a finite time period to recognize noise as such. During the interval between the end of the carrier signal and the start of muting, a burst of noise known as a squelch-tail is emitted by the radio receiver. The length of this tail is typically between 5 and 100 milliseconds.

The elimination of the squelch-tail and of the resulting erroneous data characters has been recognized as a problem, and proposals have been advanced for its resolution. In one such approach, activation of the squelch circuit is sped up to reduce the squelch-tail duration in strong signal conditions. (See, e.g., U.S. Pat. No. 4,359,780 to Day, dated Nov. 16, 1982.) Data Communication devices, however, do not distinguish actual data from noise incorrectly interpreted as data characters, and thus allow characters to be added to the data transmission. It is particularly important in data communication systems that each bit of transmitted data, even the last bit, be received and interpreted accurately.

In another approach, as seen in U.S. Pat. No. 4,153,878 to Osborn, dated May 8, 1979, data from the receiver is delayed by the period of time required to activate the muting in the squelch circuit. This approach, however, requires careful matching of the delay time to the response time of the squelch circuit. In addition, such delays may cause interference with subsequent transmissions.

Another approach uses an additional tone to indicate the period of signal transmission and to activate the squelch circuitry to eliminate the squelch-tail. (See U.S., e.g., Pat. No. 3,584,304 to Casterline, et al., dated June 8, 1971, and U.S. Pat. No. 3,654,555 to Ryan, et al., dated Apr. 4, 1972.) The use of a tone requires the addition of circuitry to add, detect, and then delete the tone. In addition, tone recognition, like noise recognition, takes time. In high speed data communication systems, such time delays may be unacceptable.

It is accordingly an object of the present invention to provide a novel system and method for eliminating the squelchtail in radio receivers used in data communication systems.

It is another object of the present invention to eliminate the squelch-tail in data communication system radio receivers without adding false data signals to, or deleting active data from, the end of the data transmission.

It is yet another object of the present invention to eliminate the squelch-tail and accurately interpret the last data bit in a data transmission.

It is a further object of the present invention to eliminate the squelch-tail in radio receivers used in data communication systems without including circuitry for a separate tone or delay line for squelch-tail elimination.

These and many other objects and advantages will be readily apparent to one skilled in the art to which the invention pertains from a perusal of the claims and the following detailed description of preferred embodiments and read in conjunction with the appended drawings.

THE DRAWINGS

FIG. 3 is a partial block and partial schematic diagram of an embodiment of the squelch-tail eliminator of the present invention.

FIG. 4 is a schematic diagram of the silence sensor of the embodiment of FIG. 2.

FIG. 5 is a block diagram of a modem modification for the squelch-tail eliminator of the present invention.

DETAILED DESCRIPTION OF PREFERRED EMBODIMENTS

Figure 1:
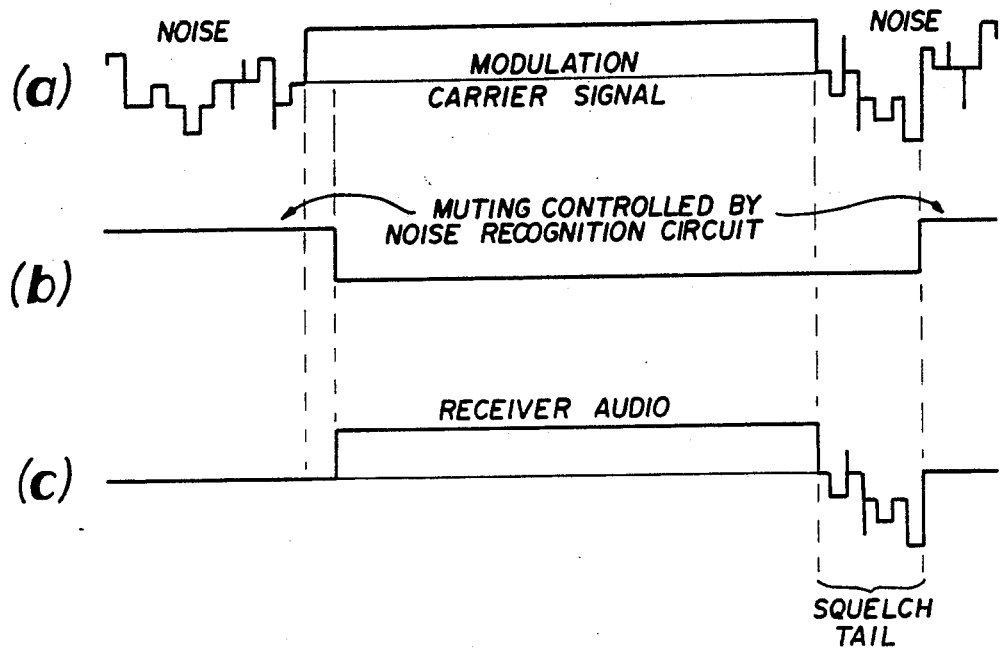
FIG. 1 is a timing diagram illustrating the period of the squelch-tail in the prior art.

With reference to FIG. 1, line (a) illustrates the time during which data are transmitted in a data communication system. Typically, data bits are coded as either zero or one, and the carrier signal is modulated at one of two frequencies indicative of the code of the data bit. Because the stream of data bits is continuous, the carrier signal is continuously modulated during transmission.

Line (b) of FIG. 1 illustrates the time of operation of a typical noise squelch circuit in a communication system. Such a circuit includes a noise recognition circuit and a device for muting the radio receiver output responsively to the noise recognition circuit. The time required to recognize the noise introduces a delay before activation of the muting device. Line (c) illustrates the receiver audio output of such prior art squelch circuitry. The time delay between the end of data transmission and the triggering of the muting device in the noise squelch circuit, the period of the squelch tail shown on line (c), is normally 5 to 100 milliseconds, depending on the strength of the carrier signal.

Figure 2:
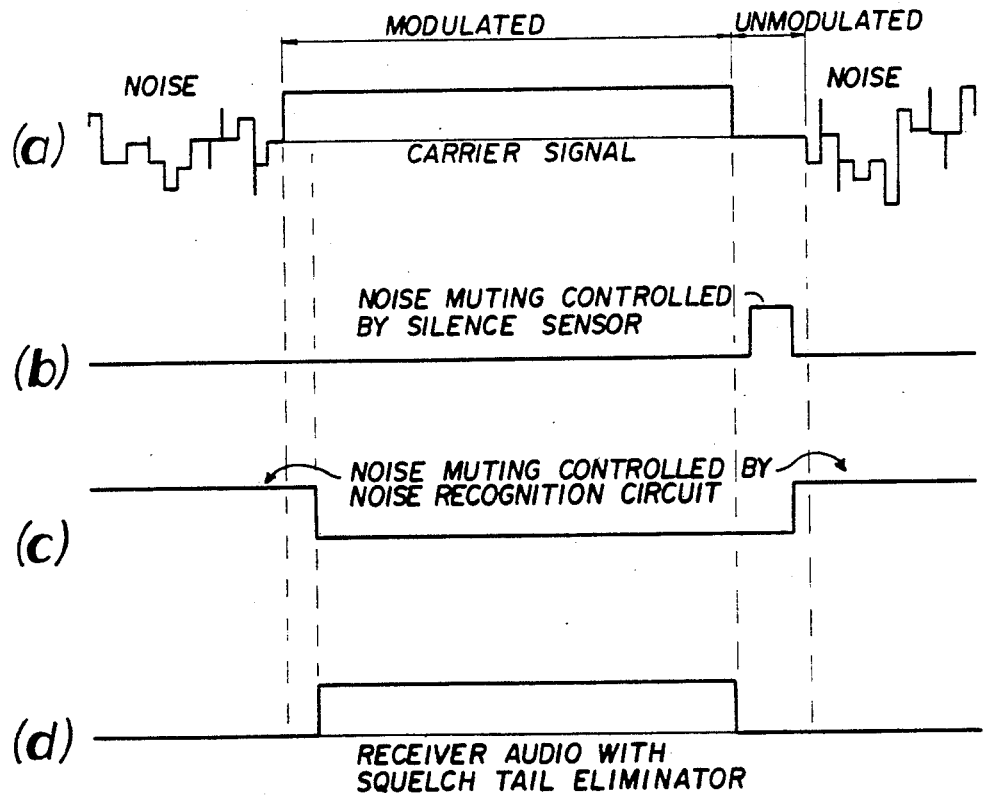
FIG. 2 is a timing diagram illustrating the operation of the squelch-tail eliminator of the present invention.

With reference now to FIG. 2, the present invention takes advantage of the fact that modulation is always present in a data communication system during data transmission by adding a brief period of unmodulated carrier signal to the end of the modulated carrier signal, as illustrated in line (a). During this period of unmodulated carrier signal, there is no audio output from the receiver because there is no modulation on the carrier signal. The period is therefore a period of silence. Upon sensing the silence, the squelch-tail eliminator of the present invention triggers the muting device in the receiver for the period shown in line (b). After the end of the carrier signal, the muting device is triggered by the noise recognition circuit as shown in line (c). Operation of the noise recognition circuit is initially triggered by the squelch-tail eliminator, before the noise is recognized. Line (d) illustrates the final recovered audio without the squelch-tail.

With reference now to the embodiment of the squelch-tail eliminator device of the present invention illustrated in FIG. 3, the device may be constructed of a transmitter 10 and receiver 100. The transmitter 10 may include a modem 20, silence circuitry 30 for adding the period of unmodulated signal, a transmitting unit 40, and an antenna 60. The receiver 100 may include an antenna 110, a receiver unit 120, a noise recognition circuit 140, a silence sensor 200 to detect the period of silence, and muting device 150 to mute the output from the receiver 100.

The modem 20 of the transmitter 10 receives data over transmit data line 12 and supplies the modulation necessary to identify the bits. The data are conveyed to a transmitter unit 40 over audio output line 16 where the modulated signal is added to the carrier signal, and thence to an antenna 60. Instructions (i.e., request to send) to the modem are forwarded on lines 14 and 18. In the prior art, the carrier signal and the modulation end simultaneously. In the present invention, silence circuitry 30, with capacitor 32, resistor 34, and blocking diode 36, extends the period of the carrier signal by adding an unmodulated portion. The appropriate length for this portion is approximately 5 milliseconds in a narrowband data communication system wherein data are transmitted at approximately 1200 bits per second. The length of the period may vary depending on the application, data rate, and bandwidth of the system. Shorter periods run the risk that the period may not be recognized in the receiver's silence sensor 200 and longer periods may interfere with the high speed exchange of data.

Signals received on antenna 110 are conveyed to the receiver unit 120, where the transmitted modulation is recovered. The recovered audio (i.e., the data and the period of silence) proceeds to a typical noise recognition circuit 140. Such circuits normally include noise filters 142, detector diodes 144, resistor 146, and charging capacitor 148. The circuit 140 responds to the noise by charging capacitor 148, which, once charged, has a voltage sufficiently high to cause muting device 150 to mute the noise. (In the prior art, the squelch-tail occurs during the time required to charge capacitor 148.) A typical muting device such as circuit 150 includes an operational amplifier 180, which operates a muting switch 190 in conjunction with the squelch adjustment set by resistor 170.

The silence sensor 200 also receives the recovered audio from the receiver unit 120 and is also connected to the muting device 150 and charging capacitor 148. The silence sensor 200 may be more clearly seen in FIG. 4. In addition to the numerical designation of elements in FIG. 4, values for voltage sources, resistors, and capacitors are included to facilitate an understanding of the invention. These values are typical and may be varied to suit the particular application of the user. Audio from receiver unit 120 is coupled by capacitor 210 into the full wave rectifier 220. The full wave rectifier 220 includes operational amplifiers 225 and 235, diodes 222 and 232, and resistors 236, 237, and 238. The full wave rectifier 220 charges capacitor 240 up to a voltage corresponding to the peak audio received from receiver unit 120. When the period of silence begins, that is, when the voltage from the receiver unit 120 drops to zero, the capacitor 240 discharges through resistors 236, 237, and 238. The discharge of capacitor 240 operates the muting device 150 and charges capacitor 148 through comparator 250. Comparator 250 includes operational amplifier 260 and resistors 270 and 275. Once the voltage at capacitor 240 has dropped sufficiently, the output of operational amplifier 260 goes high, charging capacitor 148 before the noise is recognized by circuit 140. Resistors 270 limit how fast and how far capacitor 148 will be charged. Once the noise is recognized in circuit 140, capacitor 148 and muting device 150 operate normally.

While the squelch-tail eliminator circuitry just described will effectively eliminate all erroneous data inputs after the end of the data transmission, there remains the possibility that the last data bit in the data transmission will be erroneous. For example, transmitter 10 could cut off a cycle of the modulation at an intermediate point when the data transmission stops, thereby causing the receiver 100 to generate one false bit at the end of the data stream. The invention will eliminate the false bit at the end of the data stream by forcing the modem to complete the cycle, rather than stopping at an intermediate cycle point.

A modem with the modifications of this invention is seen in FIG. 5. Typically, a tone oscillator 29 in a modem 20 receives data on line 12 and stops and starts a corresponding audio output on line 16 responsive to a request to send signal on line 14. The output in line 16 stops immediately when a tone inhibit signal is received. In the present invention, when the signal on line 14 indicates the end of data transmission, delay device 28 causes the tone inhibit signal to be delayed until completion of the last cycle of the modulation. Device 28 is a clocked delay device, such as a D flip-flop or shift register. The device holds the signal received on line 14 until a clock pulse from the modem is received on line 24, thereby completing the last cycle. The clock pulses that the modem generates for line 24 and for data modulation come from the same generating oscillator and are therefore synchronized. By completing the last cycle of the modulation, the bit of data at the end of the data transmission is properly transmitted.

While the preferred embodiments of the present invention have been described, it is to be understood that the embodiments described are illustrative only and that the scope of the invention is to be defined solely by the appended claims when accorded a full range of equivalence, many variations and modifications naturally occurring to those skilled in the art from a perusal hereof.

What is claimed is:

1. In a data communication system for transmitting and receiving a data signal, said system having squelching means for muting a squelch-tail, the improvement comprising means to add a period of silence following the transmitted data signal and means to activate said squelching means in response to the detection of said period of silence following the received data signal, said period of silence being an unmodulated carrier signal.

2. The improved data communication system as defined in claim 1 wherein said period of silence is approximately five milliseconds long.

3. The improved data communication system as defined in claim 1 further comprising means for continuing said data signal transmission until completion of a signal modulation related to the last data bit to be signal transmitted, whereby the last data bit in said data transmission is transmitted correctly.

4. A data communication system comprising:
   (a) a transmitter for transmitting a carrier signal having an added period of continuous modulation followed by a first brief period of essentially no modulation; and
   (b) a receiver for receiving said transmitted signal and for providing a received signal related thereto comprising:

(1) first sensor means for detecting a lack of modulation of said carrier signal, and
(2) muting means for muting said received signal for a second brief period in response to said first sensor means.

5. The data communication system as defined in claim 4 wherein said fist brief period is approximately five milliseconds in length.

6. The data communication system as defined in claim 4 wherein said receiver further comprises a second sensor means for detecting a lack of a carrier signal and wherein said muting means comprises means for muting responsively to said second sensor means subsequently to said muting in response to said first sensor means.

7. The data communication system as defined in claim 4 wherein said transmitter further comprises a modem having means for extending the period of continuous modulation to complete the last cycle of said modulation.

8. A system for squelching noise during the brief period following the end of transmission of data in a data communication system comprising:
(a) a transmitter for transmitting a signal, said signal comprising a modulated portion for conveying said data and a brief unmodulated portion following said modulated portion;
(b) a receiver including means for receiving, detecting, demodulating, and indicating said data, including a sensor for sensing said unmodulated portion and for muting said indicating means, said sensor comprising:
(1) a capacitor,
(2) a full wave rectifier for charging said capacitor proportionally to the strength of the modulated portion of said signal,
(3) means for discharging said capacitor responsively to the sensing of said unmodulated portion, and
(4) means for muting said indication responsive to the discharge of said capacitor;
said transmitter comprising a modem having delay means for continuing said modulated portion to complete the last cycle of said modulation.

9. A method for eliminating the squelch-tail in a radio receiver used in data communication systems comprising:
(a) transmitting data in the form of a continuously modulated carrier signal;
(b) transmitting an unmodulated carrier signal at the end of the data transmission;
(c) sensing the unmodulated carrier signal; and
(d) muting the output of the receiver in response to the sensing of the unmodulated carrier.

10. In the method as defined in claim 9, an additional step comprising extending the period of continuous modulation to complete the last cycle for said modulation.

11. In a method for eliminating a squelch-tail in radio receivers used in data communication systems having the steps of (a) transmitting and receiving a continuously modulated carrier signal conveying data, and (b) muting the output of a receiver in response to an identifying signal added at the end of the modulated carrier signal conveying data, the improvement comprising the step of providing an unmodulated carrier as said identifying signal.

* * * * *

REEXAMINATION CERTIFICATE (2229th)
United States Patent [19]

Skerker et al.

[11] B1 5,014,434

[45] Certificate Issued  Feb. 22, 1994

[54] KITCHEN TOOL

[75] Inventors: Robert Skerker, Buffalo, N.Y.; William Prindle, Santa Barbara, Calif.

[73] Assignee: Robinson Knife Manufacturing Co., Inc., Springville, N.Y.

Reexamination Request:
No. 90/002,724, May 15, 1992

Reexamination Certificate for:
Patent No.: 5,014,434
Issued: May 14, 1991
Appl. No.: 437,696
Filed: Jan. 2, 1990

Related U.S. Application Data

[63] Continuation of Ser. No. 286,325, Dec. 19, 1988, Pat. No. 4,937,942.

[51] Int. Cl.$^5$ ............................................. A47J 43/28
[52] U.S. Cl. ........................................ 30/345; 30/136; 30/169; 30/324; 294/7
[58] Field of Search ................. 30/136, 123, 137, 147, 30/148, 149, 150, 324, 345, 169; 294/7, 8, 6, 2

[56] References Cited

U.S. PATENT DOCUMENTS

| | | | |
|---|---|---|---|
| 3,877,143 | 4/1975 | Montesi | 30/114 |
| 4,503,168 | 3/1985 | Hartsing, Jr. | 523/100 |
| 4,576,842 | 3/1986 | Hartsing et al. | 428/35 |
| 4,737,389 | 4/1988 | Hartsing, Jr. et al. | 428/35 |
| 4,737,414 | 4/1988 | Hirt, Jr. et al. | 428/412 |
| 4,741,955 | 5/1988 | Saito et al. | 428/325 |
| 4,877,682 | 10/1989 | Sauers et al. | 428/412 |

FOREIGN PATENT DOCUMENTS

| | | | |
|---|---|---|---|
| 1277218 | 2/1986 | Canada . | |
| 1254694 | 5/1989 | Canada . | |
| 59-37161 | 2/1984 | Japan . | |
| 59-51819 | 3/1984 | Japan | 36/4 |
| 63-152573 | 6/1988 | Japan . | |

OTHER PUBLICATIONS

"Optic"; FGB Ghidin, Sep. 1987 Brochure.
"Three New Appliance Designs Combine Advanced Materials and Energy Management Concepts"; Bergen-op-Zoom ©1985, Dec. 30, 1985, computer Abstract.
"Packing Civilisation"; Mat. Plast. Elast. Nos. 7/8, Aug. 1987, computer abstract.
"Coextruded Sheet for Packing"; Plast. Mod. Elast., Apr. 1987, computer abstract.
"Future of Plastics Packaging"; Plast. Flash, Oct./Nov. 1986, computer abstract.
"Premium-Polymer Oven Trays Enter Mass Market"; Mod. Plast. Int., Jan. 1987, computer abstract.
"GE Gets Into Package Making To Promote Engineering Resins"; Can. Plast. Sep. 1985, computer abstract.
"New Entry In Race For Plastic Food Containers"; Packaging (USA), Sep. 1985; computer abstract.
"Pet Trays Heat Up For Frozen Foods"; Plast. World, Feb. 1985, computer abstract.
"Stouffer Switching From Foil To Dual-ovenable Plastic Trays"; Food Processing, USA, 48(1) 1987, computer abstract.
"Poly (ethylene naphthalenedicarboxylate)/polyetherimide blends"; Research Disclosure, No. 283 1987, computer abstract.
J. R. Bartolomucci, "Polyetherimide", Modern Plastics Encyclopedia, Oct. 1966, vol. 63, No. 10A p. 50.
J. R. Bartolomucci, "Polyetherimide", Modern Plastics Encyclopedia, Oct. 1987, vol. 88, pp. 47-48.
D. E. Floryan and I. W. Serfaty, "Polyetherimide: More Information on a New High-Performance Resin", Modern Plastics, Jun. 1982, pp. 146 and 151.
"Dual-Ovenable Food Trays", Plastics Engineering, Mar. 1987, p. 7.
Kathleen Failla, "General Electric Plastics", Chemical Week, Nov. 12, 1986, pp. 30-33.
"Aerial Service Cart Saves Flight Weight", Plastic World, No. 11, Oct. 1985, pp. 14-16.
Gary Forger, "Engineering Resin Films Make New Inroads", Plastics World, Feb. 1984, pp. 35-39.

*Primary Examiner*—Rinaldi Rada

[57]  ABSTRACT

A kitchen tool integrally formed in one piece made of a polyetherimide, having a capacity for withstanding high temperatures and facilitating microwave use.

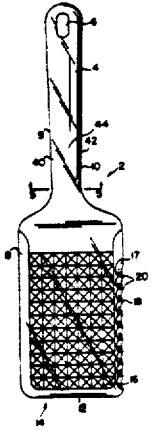

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-8 is confirmed.

* * * * *